(12) United States Patent
Wu

(10) Patent No.: US 6,204,124 B1
(45) Date of Patent: *Mar. 20, 2001

(54) METHOD FOR FORMING HIGH DENSITY NONVOLATILE MEMORIES WITH HIGH CAPACITIVE-COUPLING RATIO

(75) Inventor: Shye-Lin Wu, Hsinchu (TW)

(73) Assignee: Texas Instruments - Acer Incorporated, Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 09/313,084

(22) Filed: May 17, 1999

Related U.S. Application Data

(63) Continuation-in-part of application No. 09/046,343, filed on Mar. 23, 1998.

(51) Int. Cl.[7] .................. H01L 21/336; H01L 29/76; H01L 29/94
(52) U.S. Cl. .................. 438/264; 438/257; 438/260; 257/288
(58) Field of Search .................. 438/257, 260, 438/263, 264; 257/288

(56) References Cited

U.S. PATENT DOCUMENTS

| | | | |
|---|---|---|---|
| 4,562,638 | * | 1/1986 | Schwabe et al. ............... 29/577 |
| 4,806,202 | * | 2/1989 | Tang et al. ..................... 156/657 |
| 4,894,353 | * | 1/1990 | Ibok ................................ 437/239 |
| 5,429,965 | * | 7/1995 | Shimoji .......................... 437/43 |
| 5,504,022 | * | 4/1996 | Nakanishi et al. ............. 437/43 |
| 5,814,856 | * | 9/1998 | Bergemont et al. ........... 257/319 |
| 5,970,342 | * | 10/1999 | Wu ................................. 438/260 |
| 6,043,124 | * | 3/2000 | Wu ................................. 438/260 |

* cited by examiner

*Primary Examiner*—Matthew Smith
*Assistant Examiner*—Lex H. Malsawma

(57) ABSTRACT

A method for fabricating a high-speed and high-density nonvolatile memory cell is disclosed. First, a semiconductor substrate with defined field oxide and active region is prepared. A stacked silicon oxide/silicon nitride layer is deposited and then the tunnel oxide region is defined. A thick thermal oxide is grown on the non-tunnel region. After removing the masking silicon nitride layer, the source and drain are formed by an ion implantation and a thermal annealing. After the pad oxide film is removed, an undoped silicon film is deposited over the substrate 2 and then etched back by a dry etching. A rugged topography is then formed on the doped substrate regions. Thereafter, a thin oxide is grown on the rugged doped substrate region to form a rugged tunnel oxide. Finally, the floating gate, the interpoly dielectric, and the control gate are sequentially formed, and the memory cell is finished.

19 Claims, 4 Drawing Sheets

METHOD FOR FORMING HIGH DENSITY NONVOLATILE MEMORIES WITH HIGH CAPACITIVE-COUPLING RATIO

CROSS REFERENCE TO RELATED APPLICATIONS

This invention is a continuation-in-part application Ser. No. 09/046,343 filed on Mar. 23, 1998 titled "High Density/Speed Nonvolatile Memories with a Textured Tunnel Oxide and a High Capacitive-Coupling Ratio", and assigned to same assignee with the same inventor as the present application.

FIELD OF THE INVENTION

The present invention relates to a method for fabricating a nonvolatile memory cell, and more especially, to a method for fabricating rugged tunnel oxide with high electron injection efficiency and a large charge-to-breakdown for low power nonvolatile memory.

BACKGROUND OF THE INVENTION

Nonvolatile memories, including mask read-only memories (Mask ROM), programmable ROM (PROM), erasable programmable ROM (EPROM), electrically erasable programmable ROM (EEPROM or $E^2PROM$) and flash memories, retain their memory data whenever the power is turned off, and have wide application in the computer and electronic industry. In recent years, the markets of portable computers and telecommunications have developed rapidly and have become a major driving force in the design and technology semiconductor integrated circuit. As stated by A. Bergemont, et al., in "Low Voltage NVG™: A New High Performance 3 V/5 V Flash Technology for Portable Computing and Telecommunications Application", IEEE Trans. Electron Devices Vol. 43, p. 1510, (1996), it creates a great need for low power, high density, and electrically re-writable nonvolatile memories. That is, the memories programmable and erasable as EPROM, $E^2PROM$ or flash memories are required for aforementioned systems to store operating systems or application software.

The basic storage cell of these programmable and erasable memories contain a double polysilicon storage transistor with a floating gate isolated in silicon dioxide and capacitively coupled to a second control gate which is stacked above it. The $E^2PROM$ cell further comprises an access, or select, transistor. These memories execute the programming and erasure by charging or discharging their floating gates. For example, the EPROM is programmed by hot electron injection at the drain to selectively charge the floating gate and erased by discharging the floating gate with ultraviolet light or X-ray, which the latter has never been commercially applied for this purpose. The $E^2PROM$ and most of the flash memories are programmed by hot electron injection or cold electron tunneling named Fowler-Nordheim tunneling, and erased mostly by Fowler-Nordheim tunneling from the floating gate to the source, with the control gate ground.

Fowler-Nordheim tunneling, or cold electron tunneling, is a quantum-mechanical effect, which allows the electrons to pass through the energy barrier at the silicon-silicon dioxide interface at a lower energy than required to pass over it. H. Shirai, et al., stated in their paper "A 0.54 $\mu m^2$ Self-Aligned, HSG Floating Gate Cell for 256 Mbit Flash Memories", IEDM Tech. Dig. Vol. 95, p. 653 (1995) that, because of its low current consumption, the Fowler-Nordheim program/erase scheme becomes indispensable for low power operation of the $E^2PROM$ and flash memories. However, the Fowler-Nordheim program/erase scheme requires high voltage applied to control gate of the memory cell due to its need for a large reversible electric field to the thin oxide separating the floating gate from the substrate. Therefore, to lower the control gate bias, the memory cell must have a high capacitive-coupling ratio structure.

Y. S. Hisamune, et al., propose a method for fabricating a flash memory cell with contactless array and high capacitive-coupling ratio in "A High Capacitive-Coupling Ratio Cell for 3 V-Only 64 Mbit and Future Flash Memories", IEDM Tech. Dig. Vol. 93 p. 19, (1993). However, this method achieves high capacitive-coupling ratio with four times of polysilicon deposition and has a complex fabrication. In addition, this cell structure makes it difficult to scale the size down and increase the integration of the memory due to its short tunnel oxides. Furthermore, as mentioned by C. J. Hegarty, et al., in "Enhanced Conductivity and Breakdown of Oxides Grown on Heavily Implanted Substrates", Solid-State Electronics, Vol. 34, p. 1207 (1991), it is also difficult to fabricate a thin tunnel oxide on the heavily doped substrate with a high electron injection efficiency and a large charge-to-breakdown for low power nonvolatile memories. Thus, to reach high capacitive-coupling ratio, high electron injection efficiency and a large charge-to-breakdown with a simple manufacture is the subject of high density and low power nonvolatile memories today.

SUMMARY OF THE INVENTION

A method for fabricating a nonvolatile memory cell with rugged tunnel oxide is disclosed. First, the field oxide is formed, the active region is defined, and a semiconductor substrate is prepared. A stacked silicon oxide/silicon nitride layer is deposited on the substrate and then the tunnel oxide region is defined by a standard photolithography process followed by an anisotropic etching. A high temperature steam oxidation process is used to grow a thick thermal oxide on the non-tunnel region. After removing the masking silicon nitride layer, the phosphorus ions are implanted to form the doped regions and serve as source and drain, then a thermal annealing is performed to recover the implantation damage and to drive in the doped ions. After the pad oxide film is removed, a silicon film is deposited over the substrate 2 and then etched back by a dry etching. A rugged topography is then formed on the doped substrate regions. Thereafter, a thin oxide is grown on the rugged doped substrate region to form a rugged tunnel oxide. Finally, the first n+ doped polysilicon film which serves as the floating gate, the interpoly dielectric such as NO or ONO, and the second n+ doped polysilicon film which serves as the control gate are sequentially formed, and the memory cell is finished.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

The present invention proposes a simple method to fabricate a nonvolatile memory cell with high capacitive-coupling ratio. The method described here includes many process steps well known in the art like photolithography, etching or chemical vapor deposition (CVD) which are not discussed in detail. In addition, the present invention utilize a method for forming rugged tunnel oxide to attain high electron injection efficiency and a large charge-to-breakdown for low power nonvolatile memories.

Figure 1:
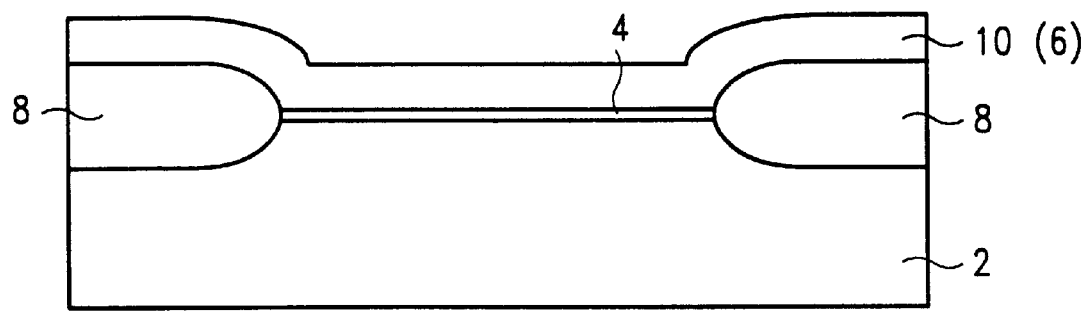
FIG. 1 is a cross-sectional view of a semiconductor wafer illustrating the step of forming a silicon oxide layer and a silicon nitride layer on the substrate according to the present invention.

Referring to FIG. 1, a single crystal silicon substrate 2 with a <100> crystallographic orientation is provided. A silicon oxide layer 4 is formed on the surface of the substrate 2. In addition to a pad oxide for the oxidation mask, the silicon oxide layer 4 can be used to act as a sacrificial oxide to prevent the channel effect during the later ion implantation. This pad oxide layer 4 has a thickness of about 40–300 angstroms, and can be grown by using thermal oxidation at a temperature of about 800–1100° C. or using low pressure chemical vapor deposition (LPCVD) at a temperature of about 400–750° C. Next, a thick silicon nitride layer 6 is deposited, for example, using a LPCVD process at a temperature of about 700–800° C., on the pad oxide layer 4 to serve as an oxidation mask.

The field oxide (FOX) pattern is now defined by using a conventional manner of photolithography including photoresist coating, exposure, and development processes, and then a dry etching is carried out to etch the thick silicon nitride layer 6 and the pad oxide layer 4. After photoresist is removed and wet cleaned, a thermal oxidation in an oxygen steam environment is performed, and the thick field oxide regions 8 are grown with a thickness of about 3000–8000 angstroms, to provide isolation between active regions on the substrate 2. Then, the silicon nitride layer 6 is optionally removed, and a new silicon nitride layer 10 is created over the substrate 2.

Figure 2:
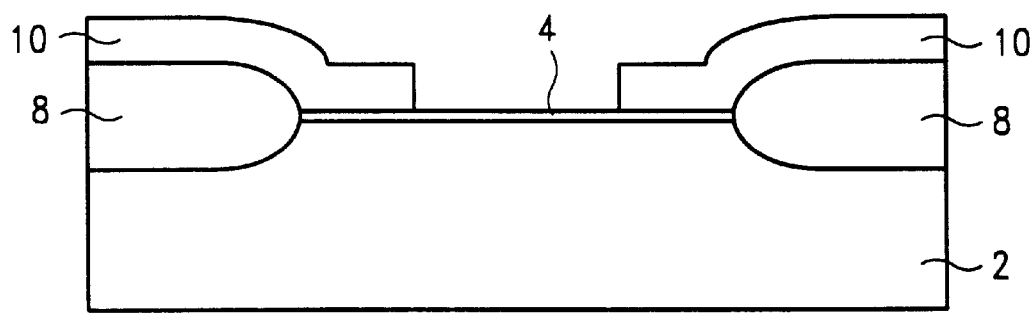
FIG. 2 is a cross-sectional view of a semiconductor wafer illustrating the step of defining the tunnel oxide regions on the substrate according to the present invention.
Figure 3:
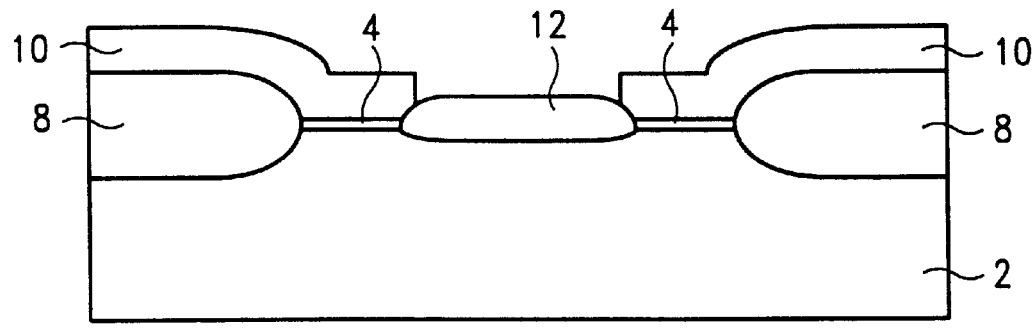
FIG. 3 is a cross-sectional view of a semiconductor wafer illustrating the step of growing a thick thermal oxide on the substrate according to the present invention.

Turning next to FIG. 2, another photolithography process is used to define the tunnel oxide region. An etching step follows to selectively etch the silicon nitride layer 10 but not the pad oxide layer 4 and expose a portion of the pad oxide layer 4 which defines the non-tunnel region on the active region. This selectivity can be reached by a dry etching process using $NF_3$ as the plasma source or by a wet etching process using hot phosphoric acid as the etching solution. It is noted that the wet etching will cause the undercut. A high temperature steam oxidation is then performed at a temperature of about 800–1100° C. to grow a thick thermal oxide 12 on the non-tunnel region, as shown in FIG. 3. This thermal oxide 12 has a thickness of about 300–2500 angstroms, and can raise the capacitive-coupling ratio of the memory cell.

Figure 4:
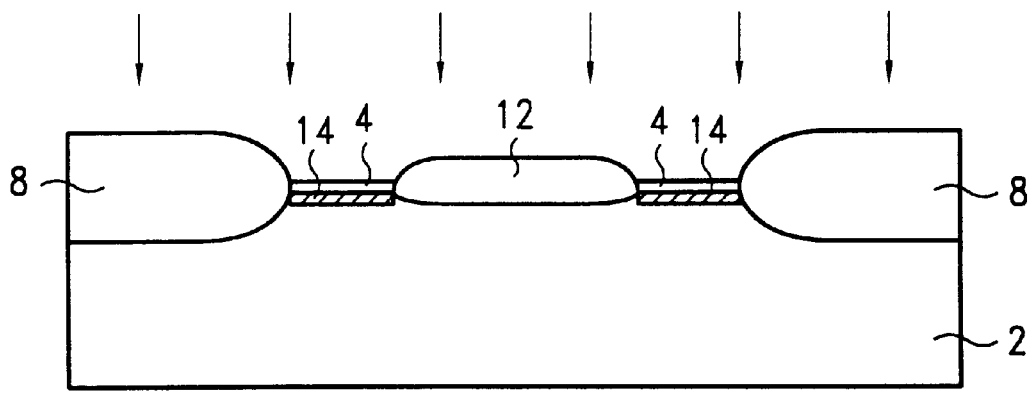
FIG. 4 is a cross-sectional view of a semiconductor wafer illustrating the step of forming the source and drain regions on the substrate according to the present invention.
Figure 5:
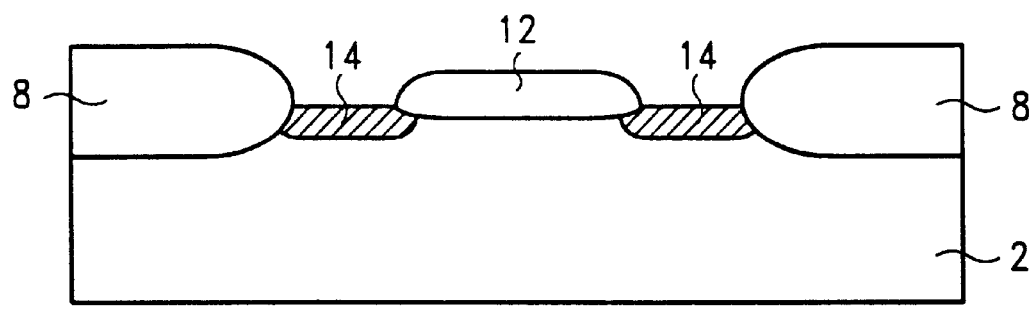
FIG. 5 is a cross-sectional view of a semiconductor wafer illustrating the step of performing a high temperature annealing and removing the pad oxide film according to the present invention.

Turning next to FIG. 4, the masking silicon nitride film 10 is removed by a wet etching with hot phosphoric acid. An n+ ion implantation is performed to implant appropriate impurity ions through the silicon oxide layer 4, but not the thick oxide 12, into the substrate 2 to form doped substrate region 14 and serve as the source and drain. The implanted ions can be selected from phosphorus ions, arsenic ions or antimony ions. The implantation energy and dosage are respectively about 0.5 to 150 keV and about $5 \times 10^{14}$ to $5 \times 10^{16}$ atoms/$cm^2$. During the ion implantation, the silicon oxide layer 4 act as a buffer to prevent the substrate 2 from damage and to prevent the doped ions from channel effect. The substrate 2 is then thermal annealed to recover the implantation damage by a preferable method as rapid thermal processing (RTP) at a temperature of about 800 to 1150° C. The dopants are activated and driven in to form the best distribution profile at this step, as shown in FIG. 5. The silicon oxide 4 is now removed, with a suitable etchant such as buffered oxide-etching (BOE) solution or diluted solution of hydrofluoric acid (HF).

Figure 6:
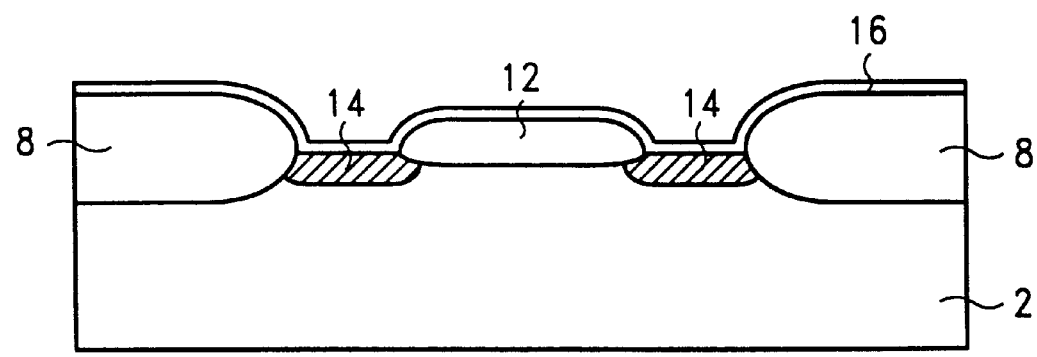
FIG. 6 is a cross-sectional view of a semiconductor wafer illustrating the step of depositing a thin, undoped silicon film on the substrate according to the present invention.
Figure 7:
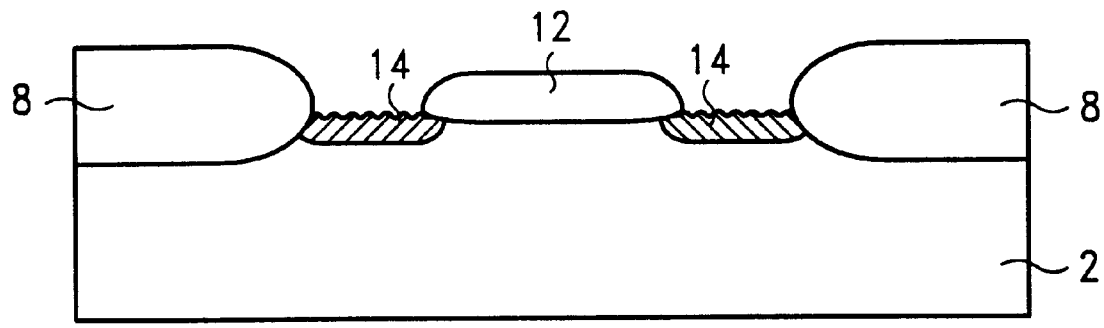
FIG. 7 is a cross-sectional view of a semiconductor wafer illustrating the step of performing a dry etching to etch back the undoped silicon film and the doped substrate to form a rugged substrate surface according to the present invention.

Referring to FIG. 6, a silicon film 16 is deposited over the substrate 2 with a thickness of about 50 to 500 angstroms. This silicon film 16 can be formed of amorphous silicon (α-Si), rugged polysilicon, or polysilicon by, for example, LPCVD, at a temperature of about 400–560° C., 560–590° C., or 590–800° C. respectively. Thereafter, a dry etching is carried out to etch back the silicon film 16. At this dry etching step, $Cl_2$, $BCl_3$, HBr, $SF_6$ or $SiCl_4$ can be adopted as the plasma gases, and the doped source and drain regions 14 of the substrate 2 can be over etched for about 20 to 100 percents. Because of the irregular atom array of amorphous silicon and the irregular grain array of polysilicon, irregular etching rates are exhibited over the etched film, and a rugged surface of the doped source and drain regions 14 will be found after the etching as shown in FIG. 7.

Figure 8:
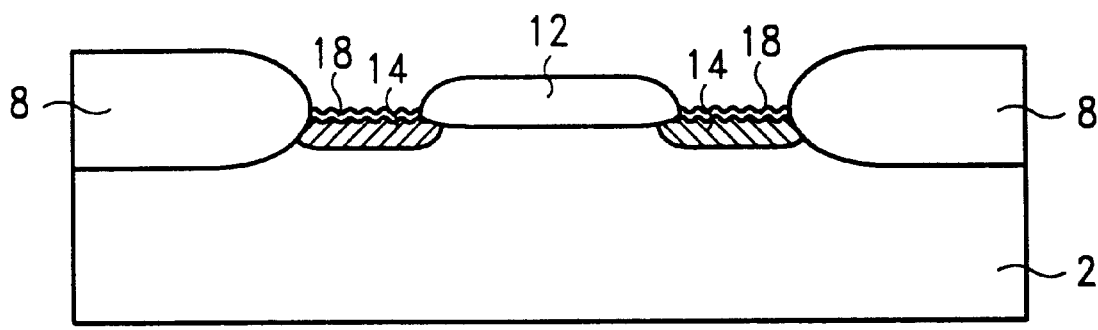
FIG. 8 is a cross-sectional view of a semiconductor wafer illustrating the step of forming a thin tunnel oxide on the rugged substrate according to the present invention.

Referring to FIG.8, a thin oxide layer 18 is now formed on the rugged doped region 14. The thin oxide layer 18 can be formed by thermal oxidation performed in a dry oxygen ambience at a temperature of about 750–1050° C., or by a chemical vapor deposition (CVD). Alternatively, a nitridation followed by a re-oxidation can be applied to form this oxide layer 18. With underlying rugged surface of the doped substrate region, a rugged tunnel oxide 18 is then formed, and a rugged $Si/SiO_2$ interface is obtained. As mentioned by S. L. Wu, et al., in "Characterization of Thin Textured Tunnel Oxide Prepared by Thermal Oxidation of Thin Polysilicon Film on Silicon", IEEE Trans. Electron Devices, Vol. 43, p. 287 (1996), this rugged interface will result in localized high electric field and subsequently enhance the electron injection from the substrate 2 into oxide. Thus, the rugged tunnel oxide exhibits higher electron-injection efficiency, a significantly lower charge trapping rate, and a large charge-to-breakdown in comparison with the conventional tunnel oxide.

Figure 9:
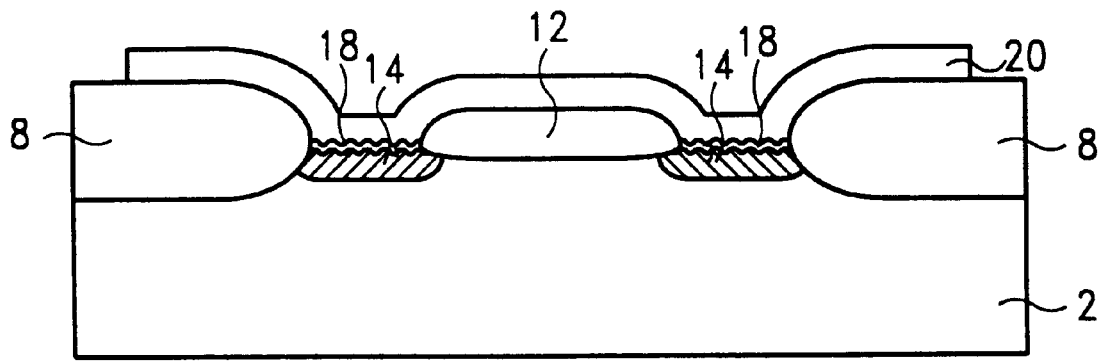
FIG. 9 is a cross-sectional view of a semiconductor wafer illustrating the step of depositing an n+ poly-Si film and then defining the floating gate according to the present invention.

Next, referring to FIG. 9, the conductive layer 20 is deposited on the substrate 2 preferably with a material of doped or in-situ doped n+ polysilicon by using a conventional LPCVD. A standard photolithography process is used to define the floating gate pattern. An anisotropic etching with $Cl_2$, $HCl_2$ or $SiCl_4$ as the plasma source is then carried out to etch the conductive layer, thereby the floating gate 20 is formed on the active region and a portion of the field oxide region.

Figure 10:
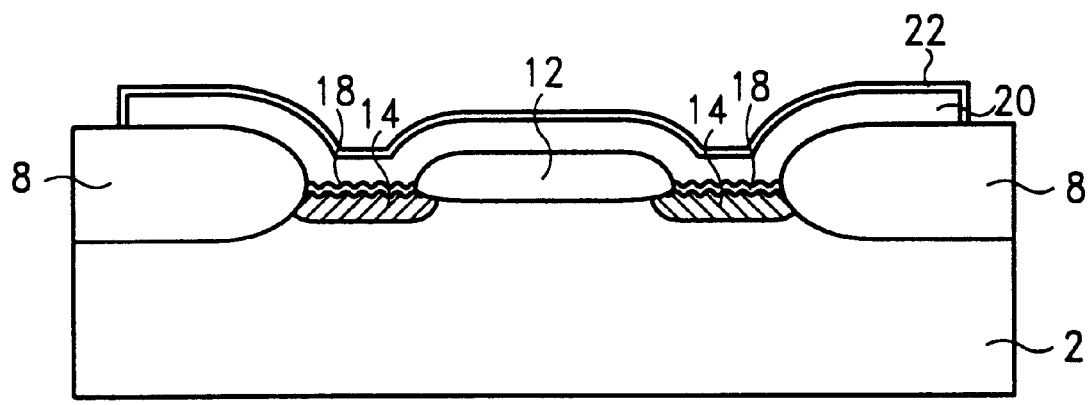
FIG. 10 is a cross-sectional view of a semiconductor wafer illustrating the step of forming an ultra-thin interpoly dielectric on the floating gate according to the present invention.
Figure 11:
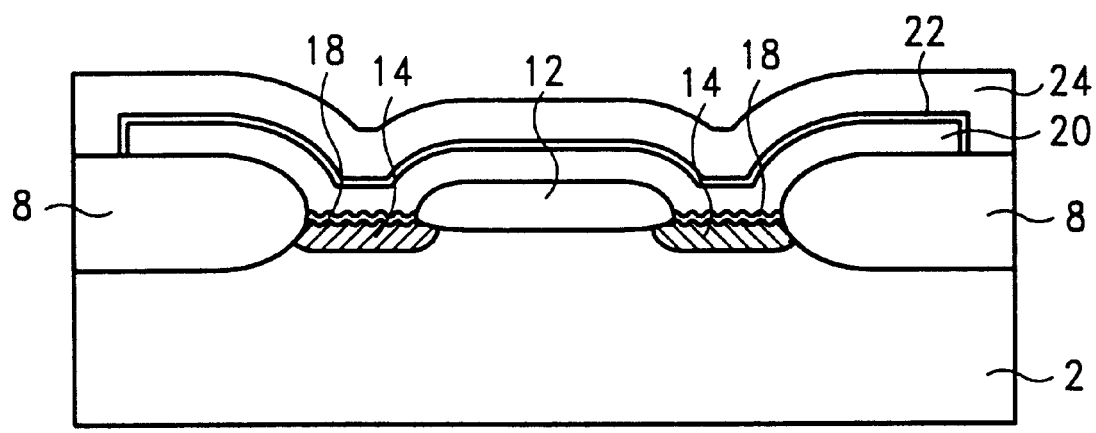
FIG. 11 is a cross-sectional view of a semiconductor wafer illustrating the step of depositing another n+ poly-Si film and then defining the control gate according to the present invention.

The ultra-thin interpoly dielectric (IPD) layer 22 deposited on the surface of the floating gate 20 is shown in FIG. 10. This interpoly dielectric layer 22 can be a material of a double film of silicon nitride and silicon oxide (NO), a triple film of silicon oxide, silicon nitride and silicon oxide (ONO), or any other high dielectric constant film such as tantalum pentoxide ($Ta_2O_5$) or barium strontium titanate (BST). Finally, referring to FIG. 11, another conductive layer formed of doped or in-situ doped n+ polysilicon is deposited and patterning on the interpoly dielectric layer 22 to serve as the control gate 24. Thus, the nonvolatile memory cell with rugged tunnel oxide is finished according to the present invention.

As is understood by a person skilled in the art, the foregoing preferred embodiments of the present invention are illustrative of the present invention rather than limiting of the present invention. It is intended to cover various modifications and similar arrangements included within the spirit and scope of the appended claims, the scope of which should be accorded the broadest interpretation so as to encompass all such modifications and similar structure.

What is claimed is:

1. A method for forming a nonvolatile memory cell with rugged tunnel oxide layers, the method comprising:

forming a silicon oxide layer on a semiconductor substrate;

forming a silicon nitride layer on the silicon oxide layer;

patterning the silicon nitride layer to define a tunnel oxide region and to expose a portion of the silicon oxide layer which defines a non-tunnel region of the semiconductor substrate;

performing a first thermal oxidation to oxidize a portion of the semiconductor substrate exposed by the silicon nitride, thereby generating a non-tunnel oxide on the semiconductor substrate;

removing the silicon nitride layer;

implanting ions into the semiconductor substrate to form doped regions to serve as source and drain using the non-tunnel oxide as a mask;

performing an annealing to the semiconductor substrate and simultaneously driving the ions into the semiconductor substrate;

removing the silicon oxide layer;

forming a silicon layer on the semiconductor substrate, wherein the silicon layer is a material selected from the group consisting of amorphous silicon, rugged polysilicon and polysilicon;

performing a dry etching to etch back the silicon layer and an upper portion of the doped regions;

forming thin oxide layers on the doped regions to serve as the rugged tunnel oxide layers;

forming a floating gate over the tunnel and non-tunnel oxides;

forming a dielectric layer on the floating gate; and forming a control gate on the dielectric layer.

2. The method according to claim 1, wherein the semiconductor substrate is a p-type substrate.

3. The method according to claim 1, wherein the silicon oxide layer has a thickness of about 40–300 angstroms.

4. The method according to claim 1, wherein the first thermal oxidation is performed in an oxygen steam ambience at a temperature of about 800–1100° C.

5. The method according to claim 1, wherein the non-tunnel oxide has a thickness of about 300–2500 angstroms.

6. The method according to claim 1, wherein the implanted ions are n-type ions.

7. The method according to claim 6, wherein the n-type ions are selected from the group consisting of phosphoric ions, arsenic ions and antimony ions.

8. The method according to claim 6, wherein the n-type ions are implanted at an energy of about 0.5–150 keV with dosage of above $5 \times 10^{14} – 5 \times 10^{16}$ atoms/cm$^2$.

9. The method according to claim 1, wherein the annealing is performed at a temperature of about 800–1150° C.

10. The method according to claim 1, wherein the silicon layer has a thickness of about 50–500 angstroms.

11. The method according to claim 1, wherein the amorphous silicon, the rugged polysilicon, and the polysilicon are formed by LPCVD at a temperature of about 400–560° C., 560–590° C., and 590–800° C. respectively.

12. The method according to claim 1, wherein the dry etching is performed with a plasma source selected from the group consisting of $Cl_2$, $BCl_3$, HBr, $SF_6$ and $SiCl_4$.

13. The method according to claim 1, wherein the rugged tunnel oxide layers are formed by a second thermal oxidation.

14. The method according to claim 13, wherein the second thermal oxidation performed in a dry oxygen ambience at a temperature of about 750–1050° C.

15. The method according to claim 1, wherein the rugged tunnel oxide layers are formed by a chemical vapor deposition.

16. The method according to claim 1, wherein the rugged tunnel oxide layers are formed by a nitridation followed by a re-oxidation.

17. The method according to claim 1, wherein the floating gate is formed by a material of doped polysilicon.

18. The method according to claim 1, wherein the dielectric layer is formed by a material selected from the group consisting of tantalum oxide ($Ta_2O_5$), barium strontium titanate (BST), a double film of silicon nitride and silicon oxide, and a triple film of silicon oxide, silicon nitride and silicon oxide (ONO).

19. The method according to claim 1, wherein the control gate is formed by a material of doped polysilicon.

* * * * *